(12) United States Patent
Zhang et al.

(10) Patent No.: US 10,199,442 B1
(45) Date of Patent: Feb. 5, 2019

(54) ORGANIC LIGHT-EMITTING DISPLAY PANEL, METHOD FOR PREPARING THE SAME, AND ORGANIC LIGHT-EMITTING DISPLAY DEVICE

(71) Applicant: Shanghai Tianma AM-OLED Co., Ltd., Shanghai (CN)

(72) Inventors: Peng Zhang, Shanghai (CN); Congyi Su, Shanghai (CN)

(73) Assignee: SHANGHAI TIANMA AM-OLED CO., LTD. (CN)

( * ) Notice: Subject to any disclaimer, the term of this patent is extended or adjusted under 35 U.S.C. 154(b) by 0 days.

(21) Appl. No.: 15/862,866

(22) Filed: Jan. 5, 2018

(30) Foreign Application Priority Data

Jul. 20, 2017 (CN) .......................... 2017 1 0596122

(51) Int. Cl.
*H01L 27/32* (2006.01)
*H01L 51/52* (2006.01)

(52) U.S. Cl.
CPC .......... *H01L 27/3246* (2013.01); *H01L 51/52* (2013.01); *H01L 51/5221* (2013.01); *H01L 51/5237* (2013.01)

(58) Field of Classification Search
None
See application file for complete search history.

(56) References Cited

U.S. PATENT DOCUMENTS

2010/0207107 A1    8/2010   Kim
2016/0248039 A1*   8/2016   Choung .............. H01L 51/5228

FOREIGN PATENT DOCUMENTS

| CN | 103963856 A | 8/2014 |
| CN | 104218050 A | 12/2014 |
| CN | 106876331 A | 6/2017 |
| CN | 106910841 A | 6/2017 |
| EP | 2958165 A1 | 12/2015 |
| JP | 2015082411 A | 4/2015 |
| KR | 100658758 B2 | 12/2006 |

OTHER PUBLICATIONS

Chinese Office Action for corresponding Chinese Application Serial No. 201710596122.5, dated Jul. 30, 2018, pp. 1-10.

* cited by examiner

*Primary Examiner* — Cheung Lee
(74) *Attorney, Agent, or Firm* — Tarolli, Sundheim, Covell & Tummino LLP (57) ABSTRACT

Provided is an organic light-emitting display panel, including: an array substrate, an organic light-emitting element arranged on the array substrate, and an encapsulation portion; the organic light-emitting element includes a reflective layer, a pixel definition layer including pixel definition parts, a light-emitting pixel layer including light-emitting pixel parts each arranged between the pixel definition parts, a cathode layer arranged on a side of the light-emitting pixel layer away from the reflective layer, and a support layer arranged between at least one pair of adjacent light-emitting pixel parts of the light-emitting pixel layer; the support layer includes a metal part and an annular organic part placed on a side of the metal part away from the array substrate; the encapsulation portion includes at least one organic encapsulation layer and at least one inorganic encapsulation layer; and the encapsulation portion covers the organic light-emitting element.

20 Claims, 10 Drawing Sheets

ORGANIC LIGHT-EMITTING DISPLAY PANEL, METHOD FOR PREPARING THE SAME, AND ORGANIC LIGHT-EMITTING DISPLAY DEVICE

CROSS-REFERENCE TO RELATED APPLICATIONS

The present application claims priority to Chinese Patent Application No. 201710596122.5, filed on Jul. 20, 2017, the content of which is incorporated herein by reference in its entirety.

TECHNICAL FIELD

The present disclosure relates to the field of display technologies and, particularly, to an organic light-emitting display panel, a display device including the organic light-emitting display panel, and a method for preparing the organic light-emitting display panel.

BACKGROUND

With the continuous development of display technology, manufacturing technology of display panel is also maturing. The conventional display panel mainly includes organic light emitting diode (OLED), liquid crystal display (LCD), plasma display panel (PDP) and the like. An organic light-emitting display device, such as a self-luminous display device, does not require a separate light source. Therefore, the organic light-emitting display device is light-weight and thin, can work at low voltage, and has high quality characteristics of wide view angle, high contrast and fast response. As a next generation of display device, the organic light-emitting display device has attracted much interest.

SUMMARY

The present disclosure provides an organic light-emitting display panel, a display device including the organic light-emitting display panel, and a method for preparing the organic light-emitting display panel.

In a first aspect, the present disclosure provides an organic light-emitting display panel, including: an array substrate; an organic light-emitting element arranged on the array substrate, the organic light-emitting element including a reflective layer, a pixel definition layer including pixel definition parts, a light-emitting pixel layer including light-emitting pixel parts each arranged between the pixel definition parts, a cathode layer arranged on a side of the light-emitting pixel layer away from the reflective layer, and a support layer arranged between at least one pair of adjacent light-emitting pixel parts of the light-emitting pixel layer, the support layer including a metal part and an annular organic part placed on a side of the metal part away from the array substrate; and an encapsulation portion, the encapsulation portion including at least one organic encapsulation layer and at least one inorganic encapsulation layer, the encapsulation portion covering the organic light-emitting element.

In a second aspect, the present disclosure provides an organic light-emitting display device, including the organic light-emitting display panel according to the first aspect.

In a third aspect, the present disclosure provides a method for preparing an organic light-emitting panel, including: preparing an array substrate; preparing an organic light-emitting element, the preparing of the organic light-emitting element including sequentially preparing, on the array substrate, a reflective layer, and a pixel definition layer including pixel definition parts, forming a light-emitting pixel layer including light-emitting pixel parts between the pixel definition parts, and forming a cathode layer on the light-emitting pixel layer, wherein a metal part is formed between at least one pair of adjacent light-emitting pixel parts at the meantime of preparing the reflective layer, an annular organic part is formed on the metal part at the meantime of preparing the pixel definition layer including pixel definition parts, and the metal part and the annular organic part together form a support layer; and preparing an encapsulation portion on a side of the organic light-emitting element away from the array substrate.

The support layer with the annular organic part formed in the present disclosure reduces the contact area between the support layer and the mask, thereby reducing the contamination of the vapor deposition mask caused by particles.

DESCRIPTION OF EMBODIMENTS

In order to better understand the above purposes, features and advantages, the present disclosure will be further illustrated as follows with reference to the drawings and specific embodiments. However, the exemplary embodiments can be implemented in various manners, and it should not be understood that the present disclosure is limited to these embodiments; on the contrary, the present disclosure can be more comprehensive and integral by providing these embodiments, which fully conveys the concept of the exemplary embodiments to those skilled in the art. In the accompanying drawings, same or similar structures are represented with same reference signs, and thus repetitive description thereof will be omitted. In the present disclosure, the terms for describing a position and a direction are explained with reference to the accompanying drawings, and the modifications within the scope of the present disclosure are also conceivable if necessary. The drawings of the present disclosure are merely intended to illustrate the relative positional relationship, and the thickness of some portions is magnified in order to facilitate understanding. The layer thicknesses shown in the drawings do not indicate the ratio of the actual layer thicknesses.

It should be understood that specific details described as follows are intended to facilitate a fully understanding of the present disclosure. The present disclosure can be embodied in many other forms other than those described herein, and those skilled in the art are able to make similar developments without departing from the concept of the present disclosure. Therefore, the present disclosure is not limited to the specific embodiments disclosed below. If specific terms are used in the description and the claims for referring to specific components, those skilled in the art should understand that the hardware manufacturers may use different terms to name same components. In the present description and claims, components are differentiated from one another by functional differences, rather than by differences in names. The expression "including" or "comprising" used in the description and claims is an open expression, and it should be understood as "including but not limited to". The following description describes the preferred embodiments of the present disclosure, for the purpose of illustrating the general principles of the present disclosure but not intending to limit the scope of the present disclosure. The protection scope of the present disclosure depends on that defined in the claims.

Figure 1:
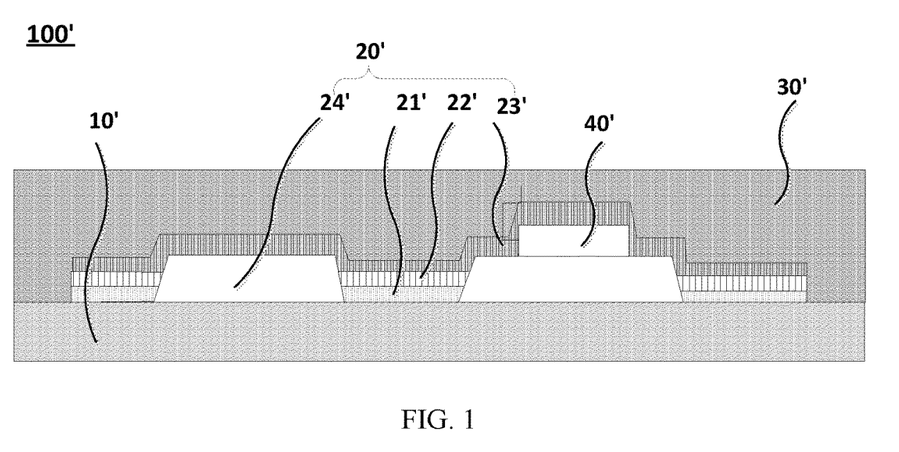
FIG. 1 is a structural schematic diagram of an organic light-emitting display panel according to the present disclosure.
Figure 2:
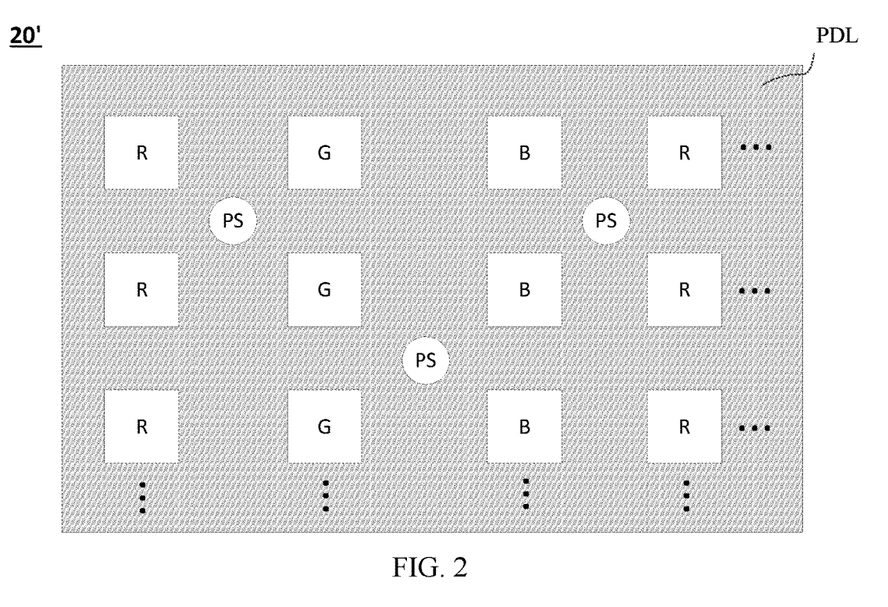
FIG. 2 is a top view schematic diagram of an organic light-emitting element of an organic light-emitting display panel according to the present disclosure.
Figure 3:
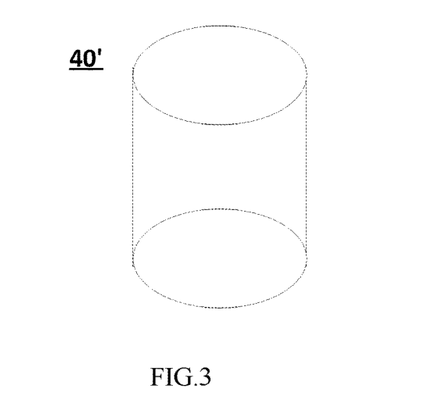
FIG. 3 is a structural schematic diagram of a pixel definition part according to the present disclosure.

FIG. 1 is a structural cross-sectional diagram of an organic light-emitting display panel 100' according to the present disclosure. As shown in FIG. 1, the organic light-emitting display panel 100' includes an array substrate 10', a light-emitting element 20' and an encapsulation portion 30'. FIG. 2 is a structural top view of an organic light-emitting element of an organic light-emitting display panel according to the present disclosure, wherein the light-emitting element 20' includes a pixel definition layer 24' including pixel definition parts, a light-emitting layer 22' and a support layer 40'. The pixel definition parts 24' separate the light-emitting layer 22' into light-emitting pixel parts (R/GB). The support layer 40' is provided on the pixel definition layer between adjacent light-emitting pixel parts, for supporting a mask during vapor deposition the light-emitting layer. FIG. 3 is a structural schematic diagram of a pixel definition part according to the present disclosure. As shown in FIG. 3, the upper surface of the support layer is a continuous surface, and the contact area between the support layer and the mask is relative large, causing contamination to the vapor deposition mask and an increase of particulates. However, most of the encapsulation portions in current flexible display are thin films, so that the number of the encapsulation portion 20' is increased, which is disadvantageous to the bending of the flexible screen. In addition, a relative great height of the support layer according to the present disclosure leads to a relatively great shadow effect during the vapor deposition of the light-emitting layer 22', which causes a color mixing.

Figure 4:
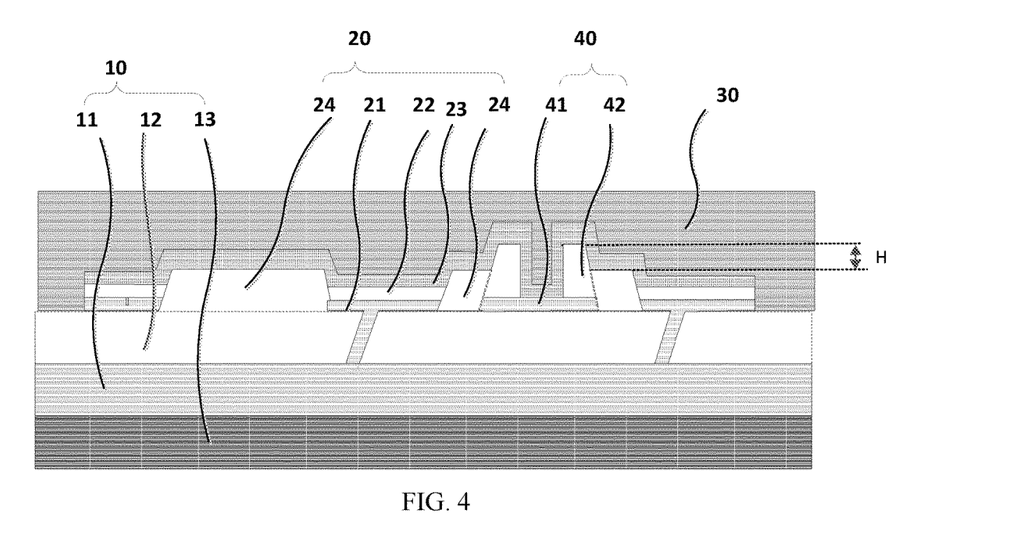
FIG. 4 is a structural schematic diagram of an organic light-emitting display panel according to an embodiment of the present disclosure.
Figure 5A:
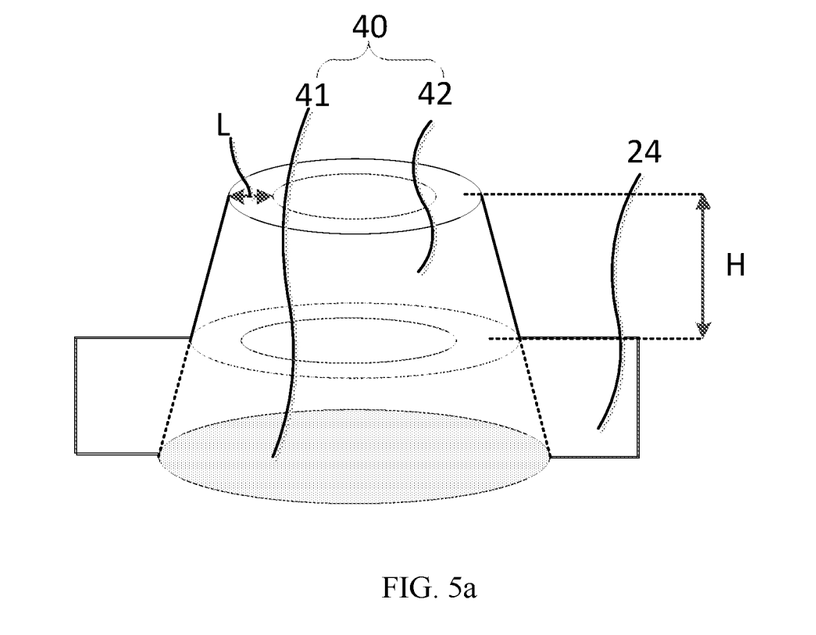
FIG. 5a is a side view structural schematic diagram of a support layer according to an embodiment of the present disclosure.
Figure 5B:
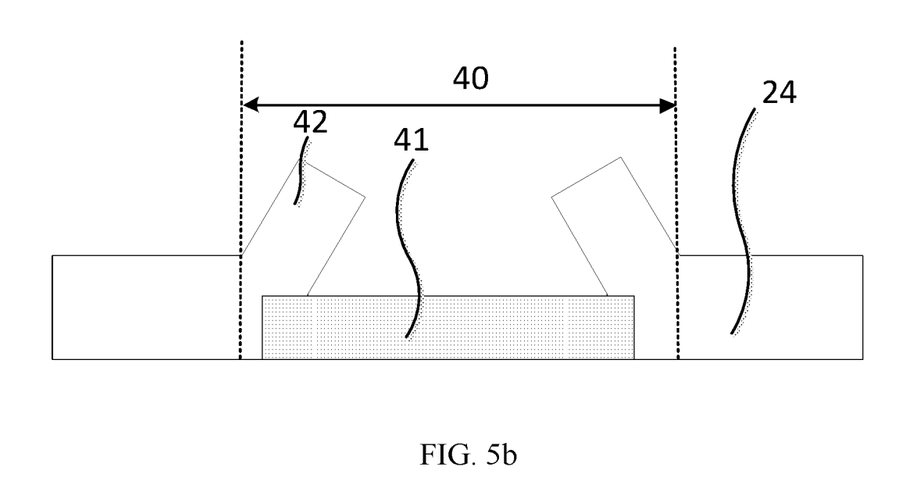
FIG. 5b is a cross-sectional structural schematic diagram of a support layer according to an embodiment of the present disclosure.

Referring to FIGS. 4, 5a and 5b, FIG. 4 is a structural schematic diagram of an organic light-emitting display panel according to an embodiment of the present disclosure; FIG. 5a is a side view structural schematic diagram of a support layer according to an embodiment of the present disclosure; and FIG. 5b is a cross-sectional structural schematic diagram of a support layer according to an embodiment of the present disclosure. Although FIG. 4 exemplifies one support layer and three light-emitting pixel parts, those skilled in the art can understand that the organic light-emitting display panel can include a plurality of support layers and a plurality of light-emitting pixel parts. An embodiment of the present disclosure provides an organic light-emitting display panel, including: an array substrate 10; an organic light-emitting element 20 arranged on the array substrate 10, and an encapsulation portion 30. The organic light-emitting element 20 includes a reflective layer 21, a pixel definition layer 24 including pixel definition parts, a light-emitting pixel layer 22 including light-emitting pixel parts each arranged among the pixel definition parts, a cathode layer 23 arranged on the side of the light-emitting pixel layer 22 away from the reflective layer 21, and a support layer 40 arranged between at least one pair of adjacent light-emitting pixel parts. The support layer includes a metal part 41 and an annular organic part 42 placed on a side of the metal part 41 away from the array substrate 10; and an encapsulation portion 30. The encapsulation portion includes at least one organic encapsulation layer and at least one inorganic encapsulation layer, and covers the organic light-emitting element 20. Referring to FIGS. 5a and 5b, the support layer according to an embodiment of the present disclosure includes a metal part 41, and an annular organic part 42 formed on the metal part 41 by the reflection effect of the metal part 41. Because the support layer according to an embodiment of the present disclosure includes the annular organic part 42, the contact area between the support layer 40 and the mask is greatly reduced compared with the solid support layer disclosed according to the present disclosure, which reduces particles and stains from wear of the support layer caused by contact or friction between the support layer and the mask, and reduces the dark spots in the encapsulation portion caused by stains or particles. As the stains and particles are reduced, the requirement on the encapsulation portion for covering particles is lowered, thereby effectively reducing the thickness of the encapsulation portion, and improving the flexibility of the organic light-emitting display panel. In an embodiment, the annular organic part may have a width of 0.2 μm-1 μm. In another embodiment, as shown in FIGS. 3 and 5a, taking an annular organic part having a upper surface with a radius of 5 μm and a width L of 1 μm as an example, the support layer according to this embodiment has a upper surface area of $\pi*5^2-\pi*4^2=9\pi$; however, when the upper surface of the support layer according to the present disclosure is a circle with a radius of 5 μm, the area thereof is $\pi*5^2=25\pi$. Compared with the related art, the upper surface area of the support layer according to the embodiment of the present disclosure is greatly reduced, thereby reducing the stains of the mask, and reducing the dark spots in the encapsulation portion caused by the stains or particles.

In an embodiment of the present disclosure, the reflective layer includes the reflective layer includes a reflective metal part and a transparent conduction part.

In a further embodiment of the present disclosure, the reflective metal part includes a material selected from a group consisting of silver, nickel, ytterbium, molybdenum, aluminum, and combinations thereof, and the transparent conduction part comprises indium tin oxide or tin oxide.

In a further embodiment of the present disclosure, the reflective layer is an indium tin oxide-silver-indium tin oxide stack structure.

In a further embodiment of the present disclosure, the metal part includes a material selected from a group consisting of silver, nickel, ytterbium, molybdenum, aluminum, and combinations thereof.

In an embodiment of the present disclosure, the support layer 40 is 0.3 μm-1.2 μm higher than the pixel definition layer 24. The smaller the height of the support layer is, the less the shadow effect, and less shadow effect can reduce the risk of color mixing, allow better film-coverage effect of the encapsulation portion, and further facilitate the thinning of the encapsulation portion. In an embodiment, the annular organic part 42 and the pixel definition layer can be prepared in a same layer, and the metal part 41 and the reflective layer 21 can be made in the same layer, thereby reducing the process and improving the process capacity. In the context, the expression "in a same layer" means that the related objects are made in the same layer, but may have different heights or widths, which is not repeated hereinafter. In an embodiment of the present disclosure, the metal part are made when the reflective layer is made, and under the stack-matching effect between an annular mask and the metal part and the reflection effect of the metal part, a support layer which is 0.3 μm-1.2 μm higher than the pixel definition layer and has an annular organic part can be formed when the pixel definition layer is made. In this way, the cost is reduced, the production capacity is increased, meanwhile the color mixing during the vapor deposition of the light-emitting pixel layer, and the stains formed by the wear of the support layer caused by the friction between the support layer and the mask are also reduced, thereby reducing the dark spots caused by stains or particles.

It should be noted that, the support layer according to the embodiments of the present disclosure is formed in a non-luminous area between adjacent light-emitting pixel parts. The support layer can be either placed in the non-luminous area between every two adjacent light-emitting pixel parts, or placed at interval of several light-emitting pixel parts and not between adjacent light-emitting pixel parts. As regards the light-emitting pixel layer arranged in an array, the support layer can be placed between adjacent light-emitting pixel parts in the row direction of the array, or placed between adjacent light-emitting pixel parts in the column direction of the array, or placed both between adjacent light-emitting pixel parts in the row direction and between adjacent light-emitting pixel parts in the column direction. The specific arrangement of the support layers is not limited in the present disclosure, and those skilled in the art can implement depending on requirements, as long as the support layers are in the non-display areas between adjacent light-emitting pixel parts, which shall all fall into the protection scope of the present disclosure.

In an embodiment, the organic light-emitting element 20 arranged on the array substrate 10 at least includes a reflective layer 21 placed on the array substrate 10, a pixel definition layer 24 including pixel definition parts, a light-emitting pixel layer 22 including light-emitting pixel parts placed between the pixel definition parts 24, a cathode layer 23 arranged on a side of light-emitting pixel layer 22 away from the reflective layer 21, and a support layer 40 arranged between at least one pair of adjacent light-emitting pixel parts. The organic light-emitting element 20 can further include one or more of a hole injection layer, a hole transmission layer, an electron blocking layer, a hole blocking layer, an electron transmission layer and an electron injection layer. The light-emitting pixel layer 22 can be a red light-emitting layer, a green light-emitting layer or a blue light-emitting layer. The light-emitting pixel layer 22 can also be a white light-emitting monolayer. The light-emitting pixel layer 22 can have a stack structure of a red light-emitting layer, a green light-emitting layer, and/or a blue light-emitting layer. The light-emitting pixel layer 22 having the stack structure may include a color filter (not shown). The hole injection layer and/or the hole transmission layer can be arranged between the reflective layer 21 and the light-emitting pixel layer 22. The electron injection layer and/or the electron transmission layer can be arranged between the cathode layer 23 and the light-emitting pixel layer 22. The hole injection layer, the hole transmission layer, the electron transmission layer and the electron injection layer can be formed on the entire display-area of the array substrate 10. The present embodiment of the present disclosure shows a top emission organic light-emitting display panel as an example, while the organic light-emitting display panel can also be a bottom emission structure in other embodiments. It should be noted that, as regards the top emission structure, the reflective layer can include a structure of ITO-Ag-ITO (i.e., indium tin oxide-silver-indium tin oxide), and the reflective layer can effectively reflect the light emitted from the light-emitting pixel layer to the exit side of light, improving the light extraction efficiency. It should be noted that, the reflection reflective layer also can be used as an anode of the organic light-emitting element 20 in addition to reflecting the light emitted from the light-emitting pixel layer, and the holes injected from the anode and the electrons injected from the cathode are combined in the light-emitting pixel layer to generate excitons which then fall from the excited state to the ground state and generate light.

In an embodiment, the array substrate 10 includes an underlay 13, an array layer 11 on the underlay 13, and a planarization layer 12 located on a side of the array layer 11 away from the underlay 13. The array layer 11 necessary for realizing display at least includes a plurality of data line metal layers and a plurality of scanning line metal layers (not shown). The array layer 11 at least includes an active layer, a source electrode, a drain electrode, a gate electrode and an insulation layer; the drain electrode of the array layer 11 is electrically connected to the reflective layer 21 of the organic light-emitting element 20; the plurality of data line metal layers and the plurality of scanning line metal layers intersect one another; the data line metal layers are electrically connected to the source electrode of the array layer 11, and the scanning line metal layers are electrically connected to the gate electrode of the array layer 11. During work, the scanning line metal layers control the on-off state of each subpixel by the gate electrode of the array layer 11, and the data line metal layers are electrically connected to the reflective layer 21 of the organic light-emitting element by the source electrode of the array layer 11, so that when the thin-film transistor corresponding to each sub-pixel is turned on, a data signal is provided for each sub-pixel to control the display of each sub-pixel. The specific structure of the array layer 11 can refer to the known techniques, which is not repeated herein. In an embodiment, the reflective layer 21 of the organic light-emitting element 20 is located on the planarization layer 12, and is electrically connected to the drain electrode of the array layer 11 through a via-hole defined in the planarization layer 12.

In an embodiment, the underlay 13 is a flexible underlay. The material of the flexible underlay is not specifically limited in the present disclosure, and can be an organic polymer in an embodiment. For example, the organic polymer can be selected from a group consisting of polyimide (PI), polyamide (PA), polycarbonate (PC), polyethersulfone (PES), polyethylene terephthalate (PET), polyethylene naphthalate (PEN), polymethyl methacrylate (PMMA), and cycloolefin copolymer (COC).

The encapsulation portion 30 is placed on the side of the organic light-emitting element 20 away from the array substrate 10, and covers the organic light-emitting element 20 for isolating the organic light emitting element 20 from the surrounding environment, preventing water vapor and oxygen from penetrating through and eroding the organic substance in the organic light-emitting element 20. The encapsulation portion includes at least one organic encapsulation layer and at least one inorganic encapsulation layer. The material of the organic encapsulation layer can contain polymer, for example, the organic encapsulation layer can be a monolayer or stacked layers made of one or more of polyethylene terephthalate, polyimide, polycarbonate, epoxy resin, polyethylene, polyacrylate and organosiloxane. The inorganic encapsulation layer can be a monolayer or stacked layers containing a metal oxide or a metal nitride. For example, the inorganic encapsulation layer may contain any one of a group consisting of $SiN_x$ (silicon nitride), $Al_2O_3$ (aluminum oxide), $SiO_2$ (silicon oxide) and $TiO_2$ (titanium oxide). The specific material and structure of the encapsulation portion are not limited in the embodiments of the present disclosure.

Figure 6A:
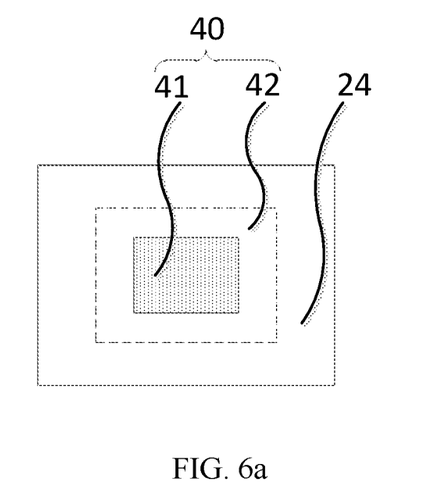
FIGS. 6a-6c are top view structural schematic diagrams of a support layer according to embodiments of the present disclosure.
Figure 6B:
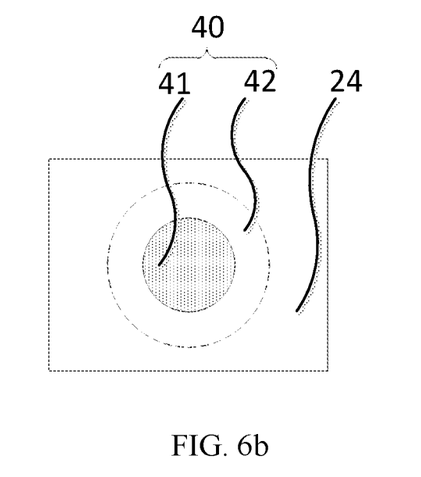
Figure 6C:
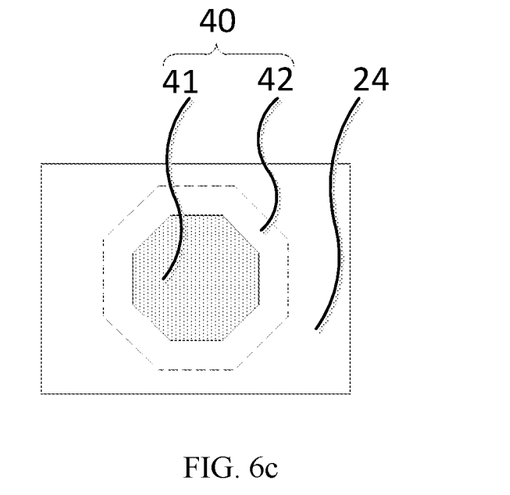

In an embodiment, referring to FIGS. 6a-6c, which are top view structural schematic diagrams of support layers according to embodiments of the present disclosure, shapes of the metal parts when viewed from top toward the array substrate can be rectangles, squares, rhombuses, circles, ellipses, polygons, or any combination thereof. In the embodiment of the present disclosure the support layer is used to support the mask during the vapor deposition of the light-emitting pixel layer, and the support layer 40 includes the annular organic part 42, thereby reducing the contact area between the support layer and the mask, reducing the stains of mask, and further reducing the dark spots in the encapsulation portion caused by stains, particles and the like. Those skilled in the art can select the shapes of the top views of the metal parts according to requirements, which is not limited to the embodiments of the present disclosure.

In addition, the present disclosure further provides a method for preparing the organic light-emitting display panel. Referring to FIGS. 7a, 7b and 8a-8e, FIGS. 7a and 7b are flow diagrams of steps for preparing an organic light-emitting display panel according to an embodiment of the present disclosure, and FIGS. 8a to 8e are structural flow diagrams of a method for preparing an organic light-emitting display panel according to an embodiment of the present disclosure. In an embodiment of the present disclosure, the method for preparing an organic light-emitting panel, including following steps.

Figure 7A:
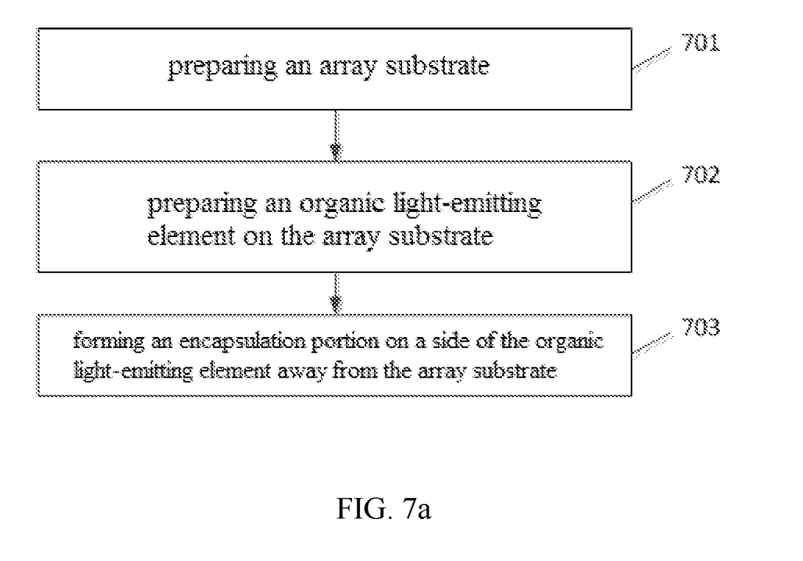
FIGS. 7a and 7b are flow diagrams of steps for preparing an organic light-emitting display panel according to an embodiment of the present disclosure.

Step 701: preparing an array substrate.

Figure 7B:
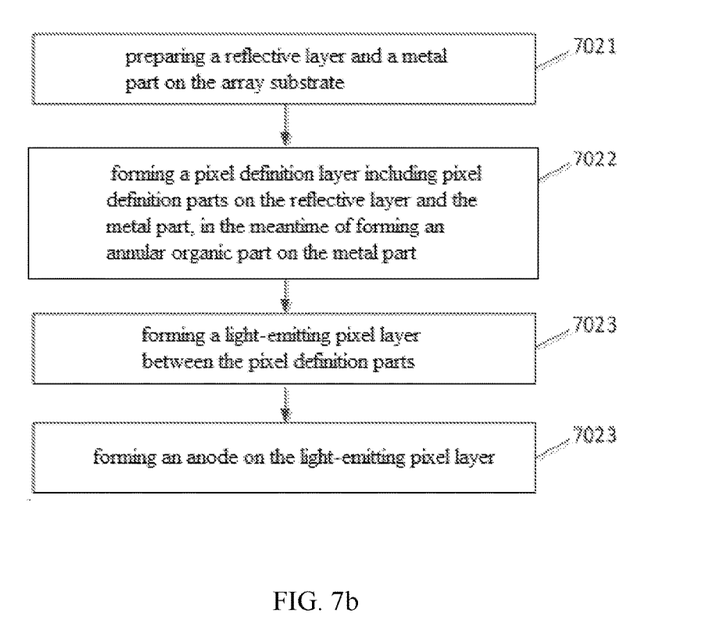

Step 702: preparing an organic light-emitting element, wherein the preparing of the organic light-emitting element includes following steps.

Step 7021: preparing a reflective layer and a metal part on the array substrate.

Figure 8A:
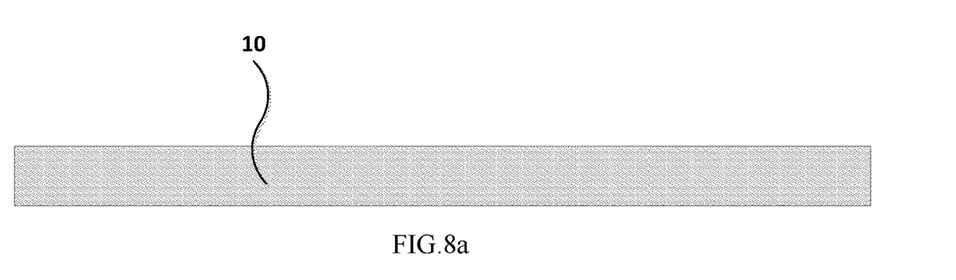
FIGS. 8a to 8f are structural flow diagrams of a method for preparing an organic light-emitting display panel according to an embodiment of the present disclosure.
Figure 8B:
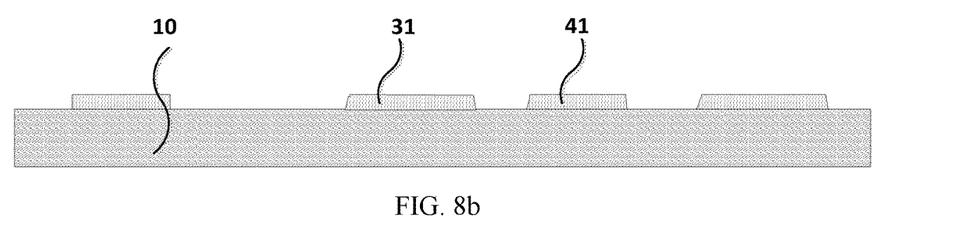
Figure 8C:
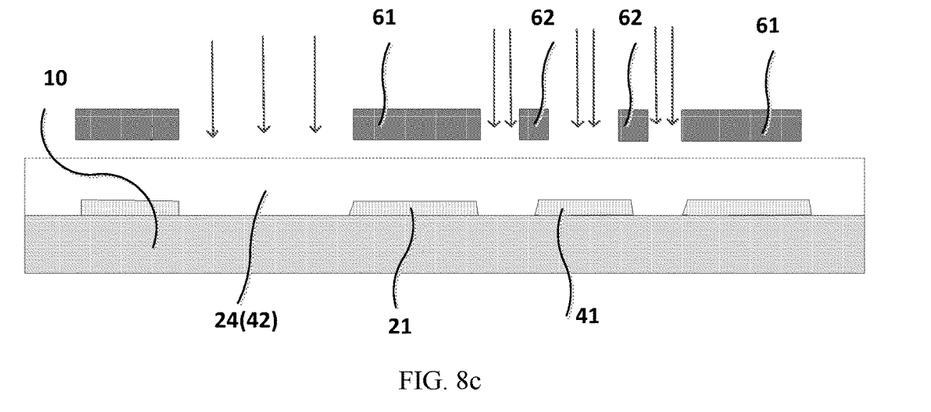
Figure 8D:
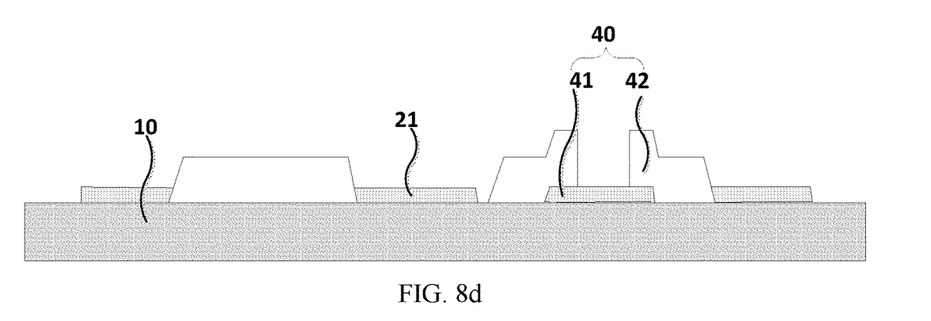
Figure 8E:
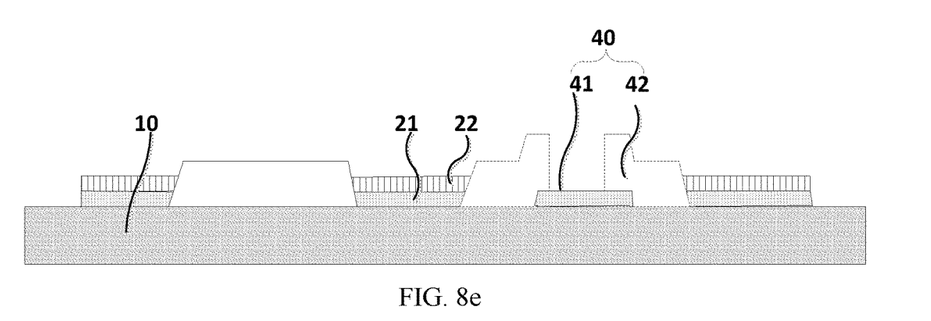
Figure 8F:
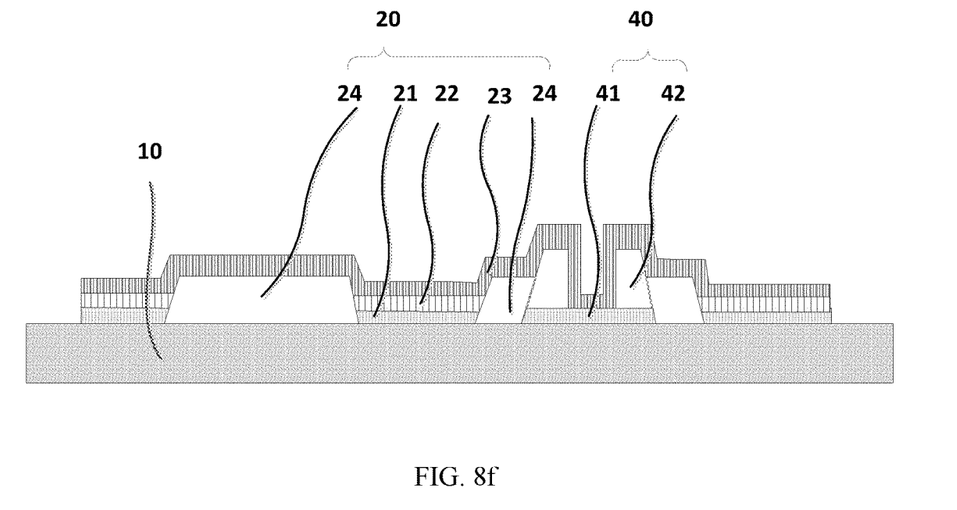
Figure 9A:
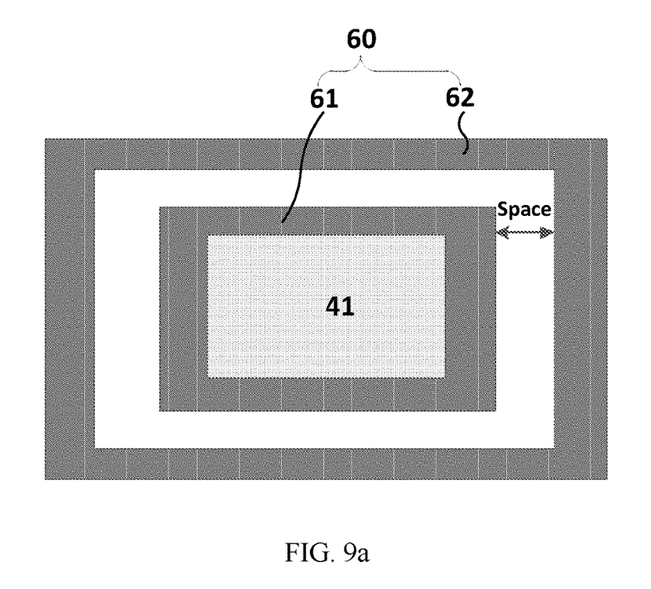
FIG. 9a is a schematic diagram of a stack-matching structure of an annular mask and a reflective layer during preparing an annular organic part, according to an embodiment of the present disclosure.
Figure 9B:
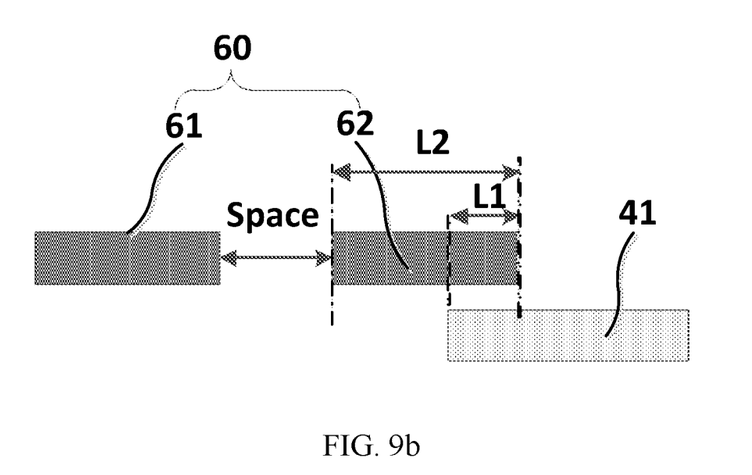
FIG. 9b is a cross-sectional schematic structural diagram of a stack-matching structure of an annular mask and a reflective layer when preparing an annular organic part, according to an embodiment of the present disclosure.

Step 7022: forming a pixel definition layer including pixel definition parts on the reflective layer and the metal part, in the meantime of forming an annular organic part on the metal part, with reference to FIG. 8c and FIG. 9b, FIG. 8c is a schematic diagram during exposure, after the material of the pixel definition layer (the annular organic part) has been coated, while FIG. 9b is a cross-sectional schematic diagram of a stack-matching structure of an annular mask and the reflective layer during preparing the annular organic part, wherein the pixel definition layer can be formed by firstly forming one organic layer by coating, then exposing the coated organic layer in light, removing the exposed area by development and keeping the area that is unexposed and covered by the mask; an annular mask is placed at the position of the metal part and in stack-match with the metal part, the organic part corresponding to the middle portion of the metal part is removed by exposing to light, and the reflection effect of the metal part strengthens the exposure of the part of the organic part corresponding to the middle portion of the metal part, so that the organic part corresponding to the middle portion of the metal part can be more easily removed when exposed in light, and the remaining organic part corresponding to the edge of the metal part is kept due to the coverage of the mask, forming the annular organic part.

Step 7023: forming a light-emitting pixel layer including light-emitting pixel parts between the pixel definition parts.

Step 7024: forming an anode on the light-emitting pixel layer;

Step 703: forming an encapsulation portion on a side of the organic light-emitting element away from the array substrate. In the method for preparing an organic light-emitting panel provided in the present embodiment, the support layer includes a metal part and an annular organic part. The metal part is formed between at least one pair of adjacent light-emitting pixel parts at the same time when preparing the reflective layer, and the annular organic part is formed on the metal part with the aid of the reflection effect of the metal part at the same time when preparing the pixel definition layer.

In an embodiment, FIG. 9a is a schematic diagram of a stack-matching structure of an annular mask and a reflective layer during preparing an annular organic part, according to an embodiment of the present disclosure. The annular organic part is formed by using an annular mask that is stacked and matched with the metal part, wherein the annular mask includes a first mask 61 and a second mask 62 surrounding the first mask 61. It should be noted that, the shape of the mask is set depending on the shape of the metal part. In the present embodiment, the annular mask is shaped like a rectangle for illustration. It is also conceivable that the annular mask is shaped like a circle or any other polygon. The support layer provided in the present embodiment includes a metal part. In the exposure process for forming the pixel definition layer, due to the stack-matching structure of the annular mask and the metal part in combination with the reflection effect of the metal part, the part of the organic part exposed to light is removed by a developer. In addition, the reflection effect of the metal part allows an enhanced exposure of the organic part exposed to light on the metal part, thereby removing the part of the organic part exposed to light on the metal part by the developer. The organic part at the edge of the metal part is remained due to underexposure, forming the annular organic part.

The method for preparing the support layer provided in the embodiment of the present disclosure can simplify the process, by preparing the support layer and the pixel definition layer at the same time. In addition, the support layer made according to the embodiment of the present disclosure includes an annular organic part, and the upper surface of the support layer is shaped like a hollow ring, which greatly reduces the contact area between the support layer and the mask, as compared with the solid support layer according to the present disclosure, thereby avoiding the dark spots caused by particles and stains due to a contact friction. As the stains and particles are reduced, the requirement on the encapsulation portion for encapsulation particles is lowered, thereby effectively reducing the thickness of the encapsulation portion, and improving the flexibility of the organic light-emitting display panel. In addition, compared with the height difference of 1.5 µm according to the present disclosure, the support layer and the pixel definition layer prepared according to the embodiment of the present disclosure can have a height difference of 0.3 µm-1.2 µm, so that shadow effect during vapor deposition of the light-emitting pixel layer can be reduced, thereby reducing the color mixing. Further, referring to FIG. 4, the support layer made according to the embodiment of the present disclosure includes an annular organic part, the hole in which can be filled with the organic part and/or the inorganic part of the encapsulation portion during the preparation of the encapsulation portion, thereby increasing the contact area between the encapsulation portion and the organic light-emitting element 20, and avoiding the problem of detachment between the encapsulation portion and the organic light-emitting element 20.

In an embodiment, referring to FIG. 9b, FIG. 9b is a cross-sectional schematic structural diagram of a stack-matching structure of an annular mask and a reflective layer when preparing an annular organic part, according to an embodiment of the present disclosure. The annular organic part is made with the aid of the reflection effect of the reflective layer, wherein the overlapping width L1 between the first mask and the metal part can be 0 µm-0.5 µm, the space of the hollow area between the first mask and the second mask can be 0.5 µm-1.5 µm, and the width L2 of the first mask can be 0.5 µm-1.5 µm.

It is found in experiments that, the influences of the overlapping width L1 between the first mask and the metal part, the space of the hollow area between the first mask and the second mask, and the width L2 of the first mask on the height difference H between the support layer and the pixel definition layer (i.e., the height of the support layer higher than the pixel definition layer) are shown in Table 1 below:

TABLE 1

Influences of L1, L2 and space on H

| Experiment No. | L1/µm | L2/µm | Space/µm | H/µm |
|---|---|---|---|---|
| Experiment 1 | 0 | 1.25 | 1.25 | 0.9 |
| Experiment 2 | 0 | 1.25 | 1 | 1 |
| Experiment 3 | 0 | 1 | 1 | 1.1 |
| Experiment 4 | 0.25 | 1.25 | 1.25 | 0.7 |
| Experiment 5 | 0.25 | 1.25 | 1 | 0.7 |
| Experiment 6 | 0.25 | 1 | 1 | 0.8 |
| Experiment 7 | 0.5 | 1.25 | 1.25 | 0 |
| Experiment 8 | 0.5 | 1.25 | 1 | 0 |
| Experiment 9 | 0.5 | 1 | 1 | 0 |

Figure 10:
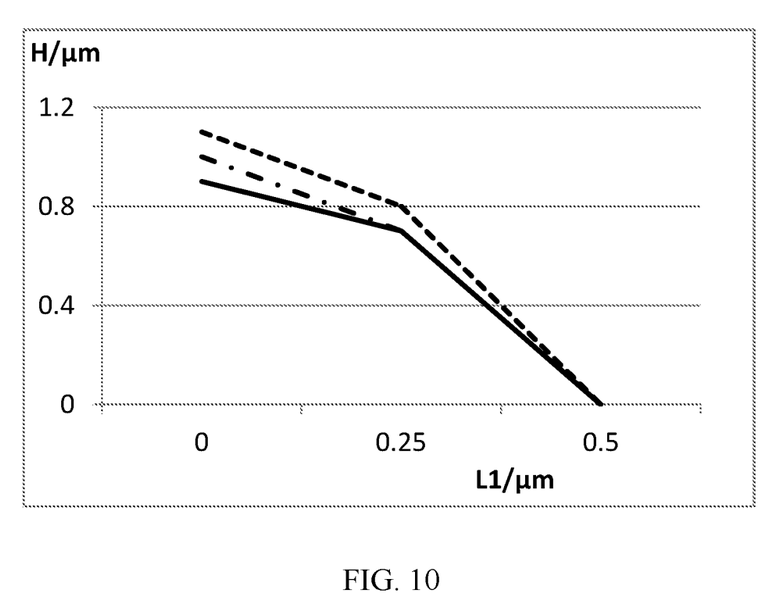
FIG. 10 is a line chart showing influence of an overlapping width L1 between a first mask and a metal part on H.

Referring to FIG. 10, FIG. 10 is a graph showing the influence of the overlapping width L1 between the first mask and the metal part on H. Respectively comparing the first group of comparative experiments: Experiment 1, Experiment 4, and Experiment 7; the second group of comparative experiments: Experiment 2, Experiment 5, and Experiment 8; and the third group of comparative experiments: Experiment 3, Experiment 6, and Experiment 9, in the case that the space of the hollow area between the first mask and the second mask is identical and the width L2 of the first mask is identical, the overlapping width L1 between the first mask and the metal part has relative greater influence on height difference H between the support layer and the pixel definition layer, and the height of the support layer decreases with the increase of the overlapping width L1 between the first mask and the metal part. An overgreat overlapping width between the first mask and the metal part leads to such a small exposure area of the organic part on the metal part that the development and the formation of the annular organic part is adversely influenced, while resulting in a formation of an over-high support layer, which readily causes the shadow effect during the vapor deposition of the light-emitting pixel layer and has negative influence on the color mixing of adjacent light-emitting pixels and the display. In an embodiment, the overlapping width L1 between the first mask and the metal part is 0 µm-0.5 µm, and the support layer is 0.3 µm-1.2 µm higher than the pixel definition layer, which can achieve the function of supporting the vapor deposition mask while reducing the shadow effect during the vapor deposition of the light-emitting pixel layer. In an embodiment, the overlapping width between the first mask and the metal part is 0 µm. When the overlapping width between the first mask and the metal part is 0 µm, the whole organic part on the metal part can be exposed to light, and with the aid of the reflection effect of the metal part on the organic part, the organic part on the metal part can be sufficiently developed, forming an annular organic part with proper width. The height difference H between the support layer and the pixel definition layer has a relative higher value, providing a better supporting effect for the mask.

Comparing experiment 1 and experiment 2, experiment 4 and experiment 5 or experiment 7 and experiment 8 respectively, in the case that the overlapping width L1 between the first mask and the metal part is identical and the width L2 of the first mask is identical, when the overlapping width L1 between the first mask and the metal part is 0 µm, the space of the hollow area between the first mask and the second mask has influence on the height difference H between the support layer and the pixel definition layer. When the overlapping width L1 between the first mask and the metal part is greater than or equal to 0.25 µm, the space of the hollow area between the first mask and the second mask substantially has no influence on the height difference H between the support layer and the pixel definition layer. In an embodiment of the present disclosure, the space of the hollow area between the first mask and the second mask is 0 µm-1.5 µm, which ensures the width of the annular organic part while improving the preparing accuracy of the mask.

Comparing experiment 2 and experiment 3, experiment 5 and experiment 6 or experiment 8 and experiment 9, in the case of that the overlapping width L1 between the first mask and the metal part is identical and the width L2 of the first mask respectively, when the overlapping width L1 between the first mask and the metal part is greater than 0.5 µm, the space of the hollow area between the first mask and the second mask has no influence on the height difference H between the support layer and the pixel definition layer.

Based on the above comparisons, it can be seen that the height difference H between the support layer 40 and the pixel definition layer 24 is mainly influenced by the overlapping width L1 between the first mask and the metal part. The height difference H between the support layer 40 and the pixel definition layer 24 can be effectively adjusted by means of adjusting the overlapping width L1 between the first mask and the metal part. In an embodiment of the present disclosure, the overlapping width L1 between the first mask and the metal part is 0 μm-0.5 μm, and the support layer is 0.3 μm-1.2 μm higher than the pixel definition layer. In an embodiment, the overlapping width L1 between the first mask and the metal part is 0 μm, so that the support layer has a sufficient height for effectively supporting the mask during the vapor deposition of the organic part.

Figure 11:
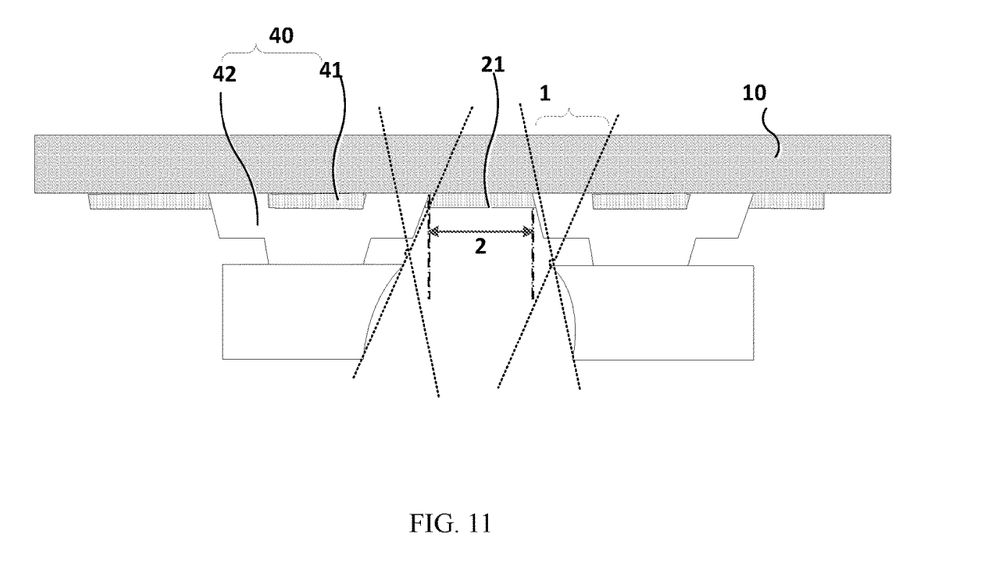
FIG. 11 is a schematic diagram during vapor deposition of a light-emitting pixel layer.

In an embodiment, FIG. 11 is a schematic diagram during vapor deposition of the light-emitting pixel layer, wherein position 2 shows a thickness assurance area of the light-emitting pixel layer, which ensures a normal vapor deposition of the light-emitting pixel layer, and position 1 represents the shadow effect area, at which the color mixing between the adjacent light-emitting pixel parts readily occurs, as shown in FIG. 11. The greater the height difference H between the support layer and the pixel definition layer, the larger the area of the position 1, and the severer the color mixing. The support layer according to an embodiment of the present disclosure includes a metal part 41. During the preparing of the pixel definition layer 24, an annular organic part 42 is formed by the reflection effect of the metal part. The metal part and the annular organic part form the support layer, and the support layer is 0.3 μm-1.2 μm higher than the pixel definition layer. Compared with the related art, the support layer according to the present disclosure is prepared in one process, and the upper portion of the support layer is an annular organic part, which can effectively reduce the contact area between the support layer and the mask, thereby reducing the stains of mask and the dark spots in the encapsulation portion caused by stains, particles and the like, as well as reducing the thickness of the encapsulation portion, which is advantageous to a flexible display. In addition, in the related art, the height difference H between the support layer and the pixel definition layer is greater than 1.5 μm, which causes a severe shadow effect during the vapor deposition of the light-emitting pixel layer and results in the color mixing between adjacent pixels. In contrast, in the embodiments of the present disclosure, the height difference H between the support layer and the pixel definition layer is 0.3 μm-1.2 μm, which can effectively reduce the shadow effect and the risk of color mixing while ensuring an effective support for the mask of the light emitting pixel layer, thereby improving the display effect.

Figure 12:
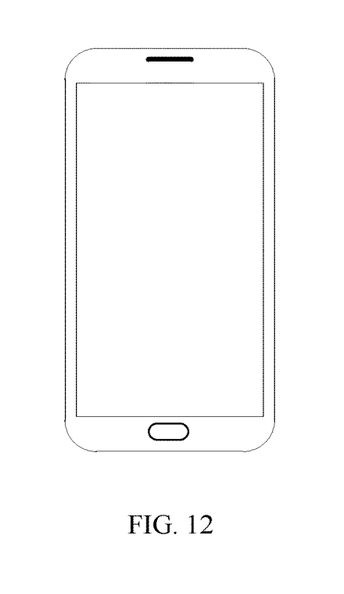
FIG. 12 is a schematic diagram of an organic light-emitting display device according to an embodiment of the present disclosure.

The present disclosure further provides an organic light-emitting display device, as shown in FIG. 12, including the organic light-emitting display panel described in any of the above embodiments. The organic light-emitting display device can be a mobile phone, a tablet computer, a wearable device, or the like. It should be understood that, the organic light-emitting display device can include a known structure, such as a driving chip, which will not be repeated herein.

The above are merely detailed description of the present disclosure with reference to specific preferred embodiments, which are not intended to limit the present disclosure. Without departing from the concept of the present disclosure, possible deductions or replacements made by those skilled in the art shall fall into the protection scope of the present disclosure.

What is claimed is:

1. An organic light-emitting display panel, comprising:
an array substrate;
an organic light-emitting element arranged on the array substrate, the organic light-emitting element comprising a reflective layer, a pixel definition layer comprising pixel definition parts, a light-emitting pixel layer comprising light-emitting pixel parts each arranged between the pixel definition parts, a cathode layer arranged on a side of the light-emitting pixel layer away from the reflective layer, and a support layer arranged between at least one pair of adjacent light-emitting pixel parts of the light-emitting pixel layer, the support layer comprising a metal part and an annular organic part placed on a side of the metal part away from the array substrate; and
an encapsulation portion, the encapsulation portion comprising at least one organic encapsulation layer and at least one inorganic encapsulation layer, the encapsulation portion covering the organic light-emitting element.

2. The organic light-emitting display panel according to claim 1, wherein the metal part and the reflective layer are made in a same film layer, and the annular organic part and the pixel definition layer are made in another same film layer.

3. The organic light-emitting display panel according to claim 2, wherein the metal part, when viewed from top toward the array substrate, is shaped like a rectangle, a square, a rhombus, a circle, an ellipse, a polygon, or any combination thereof.

4. The organic light-emitting display panel according to claim 2, wherein a height of the support layer is 0.3 μm-1.2 μm greater than a height of the pixel definition layer.

5. The organic light-emitting display panel according to claim 4, wherein a width of the annular organic part is 0.2 μm-1 μm.

6. The organic light-emitting display panel according to claim 1, wherein the array substrate comprises an underlay, an array layer placed on the underlay, and a planarization layer located on a side of the array layer away from the underlay.

7. The organic light-emitting display panel according to claim 6, wherein the underlay is a flexible underlay.

8. The organic light-emitting display panel according to claim 1, wherein the reflective layer comprises a reflective metal part and a transparent conduction part.

9. The organic light-emitting display panel according to claim 8, wherein the reflective metal part comprises a material selected from a group consisting of silver, nickel, ytterbium, molybdenum, aluminum, and combinations thereof, and the transparent conduction part comprises indium tin oxide or tin oxide.

10. The organic light-emitting display panel according to claim 8, wherein the reflective layer is an indium tin oxide-silver-indium tin oxide stack structure.

11. The organic light-emitting display panel according to claim 1, wherein the metal part comprises a material selected from a group consisting of silver, nickel, ytterbium, molybdenum, aluminum, and combinations thereof.

12. An organic light-emitting display device, comprising an organic light-emitting display panel, wherein the organic light-emitting display panel comprises:
an array substrate;
an organic light-emitting element arranged on the array substrate, the organic light-emitting element comprising a reflective layer, a pixel definition layer comprising pixel definition parts, a light-emitting pixel layer comprising light-emitting pixel parts each arranged between the pixel definition parts, a cathode layer arranged on a side of the light-emitting pixel layer away from the reflective layer, and a support layer arranged between at least one pair of adjacent light-emitting pixel parts of the light-emitting pixel layer, the support layer comprising a metal part and an annular organic part placed on a side of the metal part away from the array substrate; and an encapsulation portion, the encapsulation portion comprising at least one organic encapsulation layer and at least one inorganic encapsulation layer, the encapsulation portion covering the organic light-emitting element.

13. A method for preparing an organic light-emitting display panel, comprising:

preparing an array substrate;

preparing an organic light-emitting element, the preparing of the organic light-emitting element comprising sequentially preparing, on the array substrate, a reflective layer, and a pixel definition layer comprising pixel definition parts, forming a light-emitting pixel layer comprising light-emitting pixel parts between the pixel definition parts, and forming a cathode layer on the light-emitting pixel layer, wherein a metal part is formed between at least one pair of adjacent light-emitting pixel parts at the meantime of preparing the reflective layer, an annular organic part is formed on the metal part at the meantime of preparing the pixel definition layer, and the metal part and the annular organic part together form a support layer; and preparing an encapsulation portion on a side of the organic light-emitting element away from the array substrate.

14. The method for preparing an organic light-emitting display panel according to claim 13, wherein the annular organic part is formed by stacking and matching an annular mask with the metal part, and the annular mask comprises a first mask and a second mask surrounding the first mask.

15. The method for preparing an organic light-emitting display panel according to claim 14, wherein the annular mask is stacked and matched with the metal part, and an overlapping width between the first mask and the metal part is 0 μm-0.5 μm.

16. The method for preparing an organic light-emitting display panel according to claim 15, wherein the overlapping width between the first mask and the metal part is 0 μm.

17. The method for preparing an organic light-emitting display panel according to claim 15, wherein a space of a hollow area between the first mask and the second mask is 0.5 μm-1.5 μm.

18. The method for preparing an organic light-emitting display panel according to claim 13, wherein the metal part, when viewed from top, is shaped like a rectangle, a square, a rhombus, a circle, an ellipse, a polygon, or any combination thereof.

19. The method for preparing an organic light-emitting display panel according to claim 13, wherein a height of the support layer is 0.3 μm-1.2 μm greater than a height of the pixel definition layer.

20. The method for preparing an organic light-emitting display panel according to claim 13, wherein a width of the annular organic part is 0.2 μm-1 μm.

* * * * *